United States Patent
Urban et al.

(10) Patent No.: US 12,489,277 B2
(45) Date of Patent: Dec. 2, 2025

(54) MARX GENERATOR WITH FLUID COOLING AND GAS SPACE FOR SPARK GAPS

(71) Applicant: Diehl Defence GmbH & Co. KG, Überlingen (DE)

(72) Inventors: Jürgen Urban, Erlangen (DE); Josef Dommer, Nuremberg (DE); Christian Bickes, Röthenbach an der Pegnitz (DE); Victor Kadetov, Röthenbach an der Pegnitz (DE)

(73) Assignee: Diehl Defence GmbH & Co. KG, Überlingen (DE)

( * ) Notice: Subject to any disclaimer, the term of this patent is extended or adjusted under 35 U.S.C. 154(b) by 206 days.

(21) Appl. No.: 18/467,883

(22) Filed: Sep. 15, 2023

(65) Prior Publication Data

US 2024/0097408 A1    Mar. 21, 2024

(30) Foreign Application Priority Data

Sep. 15, 2022 (DE) ..................... 10 2022 003 392.5

(51) Int. Cl.
*H01T 15/00* (2006.01)
*H05K 7/20* (2006.01)

(52) U.S. Cl.
CPC ......... *H01T 15/00* (2013.01); *H05K 7/20272* (2013.01)

(58) Field of Classification Search
CPC .. F41H 13/0043; F41H 11/02; F41H 13/0093; H03B 11/02; H03K 3/537
See application file for complete search history.

(56) References Cited

U.S. PATENT DOCUMENTS

| 3,248,574 A | 4/1966 | Dyke et al. |
| 4,645,941 A | 2/1987 | Nicolas |
| 8,212,417 B2 | 7/2012 | Urban et al. |
| 2023/0066590 A1 | 3/2023 | Kadetov et al. |

FOREIGN PATENT DOCUMENTS

| CN | 108111147 A | 6/2018 |
| CN | 109327208 A | 2/2019 |
| DE | 102021004466 A1 | 3/2023 |
| WO | 2006008000 A1 | 1/2006 |

OTHER PUBLICATIONS

Kubota et al, "Coaxial Marx Generator for Producing Intense Relativistic Electron Beams", Japanese Journal of Applied Physics, Japan Society of Applied Physics, Japan, vol. 13, No. 2, Feb. 1, 1974, pp. 260-263, XP002183328, ISSN: 0021-4922, DOI: 10.1143/JJAP.13.260—Published in English.

*Primary Examiner* — Elmito Breval
(74) *Attorney, Agent, or Firm* — Laurence A. Greenberg; Werner H. Stemer; Ralph E. Locher

(57) ABSTRACT

A Marx configuration has a housing surrounding an interior, and a Marx generator arranged in the interior. The Marx generator has a plurality of capacitor stages connected in series, each having at least one first and one second voltage terminal, and respective cross branches. Each two adjacent capacitor stages between the first terminal of the preceding and the second terminal of the following capacitor stage are connected by one of the cross branches. Each of the cross branches contains a spark gap, a sealed gas space for an insulating gas for the spark gaps which are arranged in the interior and at least two of the spark gaps. All spark gaps are arranged in a respective gas space, and the interior contains a sealed fluid space for a cooling fluid for the Marx generator. A base support disposed in the interior and surrounds the gas space partially.

15 Claims, 4 Drawing Sheets

US 12,489,277 B2

MARX GENERATOR WITH FLUID COOLING AND GAS SPACE FOR SPARK GAPS

CROSS-REFERENCE TO RELATED APPLICATION

This application claims the priority, under 35 U.S.C. § 119, of German Patent Application DE 10 2022 003 392.5, filed Sep. 15, 2022; the prior application is herewith incorporated by reference in its entirety.

FIELD AND BACKGROUND OF THE INVENTION

The invention relates to a Marx arrangement containing a Marx generator in a housing, the Marx generator having spark gaps.

From practical experience, it is known that Marx generators were previously built in a linear arrangement. These Marx generators were accommodated in a housing that was either completely gas-filled, thus enabling a very compact and low-inductance design. Alternatively, a gas-filled spark gap tube was integrated as a separate assembly in the housings with linear Marx generators and the installation space around the remaining components was filled with high-voltage insulating liquid. However, this resulted in a significant increase in diameter and overall length, which meant a higher inductance at the Marx generator and its cables for dissipating the generated Marx voltage.

SUMMARY OF THE INVENTION

It is the object of the present invention to propose improvements relating to a Marx arrangement.

The object is achieved by a Marx arrangement according to the independent claim. Preferred or advantageous embodiments of the invention as well as other categories of the invention can be found in the further claims, the following description, as well as the appended figures.

With the foregoing and other objects in view there is provided, in accordance with the invention, a Marx configuration. The Marx configuration includes a housing surrounding an interior and a Marx generator disposed in the interior. The Marx generator contains a plurality of capacitor stages connected in series, and each having at least one first and one second voltage terminal, and cross branches. Each two adjacent capacitor stages between the first terminal of a preceding capacitor stage and the second terminal of a following capacitor stage are connected by one of the cross branches. Each of the cross branches contains a spark gap resulting in a plurality of spark gaps. The cross branches each have at least one sealed gas space for an insulating gas for the spark gaps resulting in a plurality of sealed gas spaces. Each of the sealed gas spaces is disposed in the interior and contains at least two spark gaps, wherein all of the spark gaps are disposed in a respective one of the sealed gas spaces. The housing contains a sealed fluid space for a cooling fluid for the Marx generator. At least one base support is disposed in the interior and surrounds the at least one sealed gas space partially. At least one of the spark gaps is formed by two terminal bodies. Each of the terminal bodies contains an electrode of a respective one of the spark gaps. Wherein both of the terminal bodies are fastened to the at least one base support to form the spark gap, and the at least one sealed gas space is thereby completely surrounded by the terminal bodies.

The Marx arrangement contains a housing, the housing surrounds an interior of the housing. The Marx arrangement contains a Marx generator. The Marx generator is arranged in the interior, i.e. inside the housing. The Marx generator is in itself constructed customarily and in this respect contains several capacitor stages which—in the sense of a Marx generator—are connected in parallel when charging and in series when discharging. In this respect, the capacitor stages can be numbered as, for example, capacitor stage 1, 2, . . . , N. Each of the N capacitor stages has at least one first voltage terminal and one second voltage terminal. During operation of the Marx generator, for example positive high-voltage potential +HV is present at the first terminals and negative high-voltage potential −HV at the second terminals. The total voltage of the particular capacitor stage is then present between the two terminals during operation. In particular, the terminals form opposite longitudinal ends of the particular capacitor stage in the direction of a longitudinal axis.

In the same, customary way, the Marx generator contains cross branches. Each two adjacent capacitor stages are connected by one of the cross branches. The cross branch leads from the first terminal of a preceding capacitor stage to the second terminal of a following capacitor stage or connects these two terminals (or vice versa the second terminal to the first terminal). In this context, "following" refers to the corresponding sequence of capacitor stages in the series circuit, i.e. in the above example to the sequence 1, 2, . . . , N.

In the Marx generator, all first voltage terminals are connected customarily in series via charging impedances. Likewise, all second voltage terminals are connected in series via charging impedances. In this way, the Marx generator is charged between the same potentials. The cross branches represent open circuits here. In this respect, the capacitor stages are connected in parallel in the charging state of the Marx generator. By contrast, the above-mentioned "series connection" of the capacitor stages refers to the discharge process through the conducting or short-circuited cross branches, which is considered essential in this respect. The charging impedances act here like a respective open circuit.

In order to establish the corresponding open circuit during charging and short circuit during discharging and thus the series connection, each of the cross branches contains a spark gap which short circuits in the event of its breakdown.

The Marx arrangement contains at least, in particular exactly, one gas space. The gas space(s) is/are arranged in the interior and is/are sealed. In this context, "sealed" means that the gas space is separated or partitioned off from the rest of the interior or an environment of the Marx arrangement/housing gas-tightly. The gas space serves to hold an insulating gas for the spark gaps or is filled with insulating gas in a finished or operating state. During operation, the flashover voltage of the spark gaps is increased compared to, for example, air. As is customary, this leads to smaller spark gaps with lower inductances at the same breakdown voltage. The gas space or each of the gas spaces contains at least two of the spark gaps. All spark gaps of the cross branches of the Marx generator are arranged in a particular gas space, in particular in the single gas space. In each of the gas spaces, all of the spark gaps are connected to each other in a communicating manner with respect to the insulating gas, i.e. gas can be exchanged between the spark gaps in the various gas spaces.

The interior also contains a fluid space that is sealed. Here too, "sealed" is to be understood to mean that the fluid space is separated or partitioned off from its surroundings, in particular the outer space and the gas space, fluid-tightly. The fluid space serves to hold a cooling fluid for the Marx generator or is filled with cooling fluid in the finished or operating state. In operation, the entire Marx generator or all components surrounded or flowed around by the cooling fluid in the housing are thus better cooled compared to, for example, a gas filling.

The Marx arrangement contains at least one, in particular exactly one, base support. The base support is arranged in the interior. The base support surrounds the or each of the gas spaces partially, i.e. not completely. In other words, the base support forms only part of the walling surrounding the gas space. The expression "partially surround" is to be understood here as meaning that the gas space is not completely enclosed by the base support alone. An opening remains, which can still be closed, for example, by a cover or another structural part (in particular a terminal body, see below. A conductor of the cross branch is not intended here), in order to completely surround the gas space. In this respect, the cover or other structural part forms the remaining region of the walling, which then completely delimits the gas space. In other words, such a cover or structural member then forms the remaining portion of the walling of the gas space. The gas space can also extend/continue into the further structural part. In this case, the structural part also delimits a part of the gas space.

At least one, in particular several or all, of the spark gaps is formed by two terminal bodies. Each of the two terminal bodies contains one of the two electrodes of the spark gap; in particular also a portion/conductor of the cross branch leading away from the particular electrode. To form the spark gap, both terminal bodies are fastened to the base support. This then fixes the electrodes to each other so that the spark gap is formed between them.

The terminal bodies are therefore components that are different from the base support, which in particular can be fastened to the latter and are actually fastened in an assembly state. Only when the polar bodies are fixed or attached to the base support is the gas space completely surrounded. In this respect, the terminal bodies form one of the above-mentioned structural parts that form or contribute to a respective further portion of the walling of the gas space.

At least one of the gas spaces, in particular the only gas space, contains in particular at least two gas connections leading out of the housing. In this way, the gas space can be connected to a gas supply for insulating gas, for example, in order to fill the gas space, but in particular to flow insulating gas through the gas space.

In particular, the fluid space also contains at least two fluid connections that lead out of the housing. In this way, the fluid space can be connected to a fluid supply for cooling fluid, for example in order to fill the fluid space, but in particular to flow cooling fluid (cooled back in a cooling circuit) through the gas space. At least one of the base supports, in particular the only base support, is designed in particular in one piece, for example as a solid material block, for example made of plastic.

According to the invention, a coolable, low-inductance coaxial Marx is obtained. This applies in particular if the capacitor stages of the Marx are formed in accordance with published, non-prosecuted German patent application DE 10 2021 004 466.5 (application date DPMA (German Patent and Trade Mark Office): 02.09.2021, title: "Pulse generator for a HPEM pulse"). In other words, if the capacitors in the form of capacitor stages are also present arranged spatially along a line of progression, at each of the two ends of which one of the output terminals for the Marx voltage is located, the distance between the output terminals being smaller than the longitudinal extent of the Marx generator along the line of progression. The basic principle of such an arrangement along a line of progression (circle, S-shape, zigzag) is explained in German patent application DE 10 2021 004 466.5, in particular on the basis of FIGS. 2-5 and the associated description. The relevant disclosure content of German patent application DE 10 2021 004 466.5 is therefore included in the present application, provided that this does not contradict the present application, in particular the present addition of the gas space and the fluid space. The resonator proposed there does not necessarily have to be adopted; only the structural arrangement of the Marx generator is decisive.

The low-inductance (coaxial) Marx generator of German patent application DE 10 2021 004 466.5 arranged along the line of progression may in particular be completely filled with gas (its housing 54) and thus may not be suitable for prolonged operation. In the present corresponding (coaxial) Marx generator, supplemented by the gas space and the fluid space, a gas space is integrated in such a way that in particular the capacitor and resistor assemblies (capacitor stages, charging impedances) can be operated cooled via a fluid in the form of a high-voltage insulating liquid in a fluid space of approximately the same size.

According to the invention, the operating time of a low-inductance (coaxial) Marx generator in particular is extended without at the same time negatively influencing its advantages of small size and design (possibly arranged around the resonator). If the cooled generator were to be significantly larger, this would counteract the voltage gain achieved by the Marx generator (or the field strength gain of the resonator).

The invention is based on the consideration that, in practice, Marx generators were previously built in a linear arrangement. These were either completely filled with gas, thus a very compact and low-inductance design was possible. The low-inductance design leads to a faster transfer of the high voltage from the Marx generator to a resonator fed by it, if used appropriately. This results in higher charging voltages of the resonator before the spark gap of the resonator is ignited, which in turn results in higher field strengths radiated by the resonator.

Alternatively, a gas-filled spark gap tube was integrated into the linear Marx generators as a separate assembly and the space around the remaining components (basically the capacitors and resistor units) was filled with high-voltage insulating liquid. However, this resulted in a significant increase in diameter and length, which meant a higher inductance.

With such liquid-filled Marx generators, the charging voltage can only be transferred to the resonator relatively slowly when used appropriately. As a result, the spark gap of the resonator ignites at a smaller voltage amplitude and the radiated field strength is lower than when using the smaller, gas-filled Marx generators with lower inductance characteristics.

The invention is further based on the following finding: The influence of the recharging speed with which an overvoltage above the actual DC breakdown voltage is applied to a spark gap (as installed in a resonator) on the amplitude of the ignition voltage is known as the so-called time-area law according to Kind from the year 1957. A higher ignition voltage of the spark gap in the resonator implies a higher radiated field strength. These are the physical principles of this power increase from gas discharge physics.

The teaching of the above-mentioned German patent application DE 10 2021 004 466.5 allows these principles to be used in HPEM resonators or the specific implementation in the low-inductance design of Marx generators, which are electrically and geometrically adapted to the resonators as a load. However, the Marx generator proposed in German patent application DE 10 2021 004 466.5 does not have sufficient cooling capability and therefore represents a design that is not robust in respect of long-term operation.

The invention is further based on the finding that the design of spark gap tubes of linear Marx generators known from practice so far is not realizable or is only realizable with difficulty for low-inductance, coaxial Marx generators.

These previous spark gap tubes known from practice are configured as cylindrical winding bodies or pressure bodies which are suitable for a linear arrangement, but not for the coaxial or circular, S-shaped etc. arrangement as proposed in German patent application DE 10 2021 004 466.5.

According to the invention, the previous conflict of objectives can be overcome: This exists between, on the one hand, either small, compact, exclusively gas-filled Marx generators, which thus are not robust in respect of continuous operation, for high field strengths of the connected resonator, versus, on the other hand, liquid-filled Marx generators that are thus robust in respect of continuous operation, but are large, more inductive and thus generate less field strength.

According to the invention, a low-inductance and 'coaxial', actually ring-shaped configuration of a Marx generator is obtained, which results in a freely designable—within customary limits—arbitrarily formable gas space with size-reducing, external high-voltage insulators (see below). This results in a coolable Marx generator of approximately the same size, which at the same time retains the low-inductive advantages of the small size and design.

In a preferred embodiment, at least one of the terminal bodies surrounds part of the gas space. In other words, the body not only forms a missing part of the wall of the gas space as explained above, but the gas space actually continues into the terminal body. Thus, the gas space extends into both the base support and the polar body. A corresponding terminal body offers, among other things, advantages with regard to the electrical insulation possibility of the spark gaps.

In a preferred variant of this embodiment, at least one of the terminal bodies contains a pot-shaped insulator extending along a terminal axis. In other words, the insulator follows a straight circular-cylinder shape with a bottom. The terminal body further contains a conductor which also extends at least partially in the insulator along the terminal axis. The conductor thus runs in the interior of the terminal body, which is surrounded by the insulator in the shape of a pot. The conductor forms a portion of the cross branch. The conductor has the electrode at its free end, i.e. on the side facing the pot opening, not the bottom of the pot. In particular, the conductor runs outside the insulator, then passes through the bottom of the pot shape and then runs inside the insulator (wall of the pot shape) until it ends at the electrode. Here, too, there are advantages with regard to the electrical insulation of the spark gaps.

In particular, the insulator has path-extending ribs lying in the interior of the pot or pointing towards this interior. These ribs extend in particular transversely to the terminal axis or the direction of extent of the conductor.

The terminal axis or a circular cylinder corresponding to the pot shape runs in particular parallel to a longitudinal axis of the base support (in the mounted state of the terminal bodies thereon), the capacitor stages or capacitors or the housing or the Marx generator in relation to its overall arrangement (longitudinal axis in particular transverse to the plane in which the line of progression according to German patent application DE 10 2021 004 466.5 runs).

In a preferred embodiment, at least one of the terminal bodies is fastened to or in the base support by means of a pair of threads, i.e. by being screwed there with the aid of matching threads. The terminal body thus contains a (particularly external) thread, and the base support contains a corresponding counter-thread. This makes it particularly easy to fasten or attach the terminal body to the base support. A gas space that is created can thus also be sealed particularly well in the region of the thread.

In a preferred embodiment, the two terminal bodies of at least one, in particular all, of the spark gap or of a cross branch are attached to the base support on two opposite sides thereof. This makes it particularly easy to create a spark gap of a cross branch and an associated gas space.

In a preferred embodiment, at least one, in particular all, of the gas spaces in each case has one spark chamber per spark gap, the spark chambers being connected by relatively small (compared to the dimensions of the spark chamber) connecting channels in the base support (in particular with regard to their small cross-section). This results in a series of interconnected spark chambers that are connected by connecting channels for the exchange of insulating gas. Corresponding structures for suitable terminal bodies can be produced particularly easily in base supports.

In a preferred variant of this embodiment, two receptacles for the terminal bodies are provided in the base support for at least one, in particular all, of the spark gaps. Furthermore, a respective spark chamber in the form of a through-opening connecting the receptacles is made in the base support. In the base support, the connecting channels for adjacent spark chambers are created by apertures, in particular holes, which can be made obliquely from the outside (i.e. from outside the base support). In this embodiment, the base support is in particular a solid block of material. This allows a particularly simple design of the base support, especially when creating the spark chambers and connecting channels.

In a preferred embodiment, at least one, in particular several or all, of the capacitor stages is attached to the base support. This creates a mechanically particularly stable device with the help of the base support.

In a preferred variant of this embodiment, at least one, in particular several or all, of the capacitor stages is attached to the base support outside the gas space. The term "outside" means that no structural part of the capacitor stage penetrates or enters the gas space in such a way that sealing of the gas space would be necessary at this point. In other words, there is no contact between the gas space and the capacitor stage. The attachment of the capacitor steps to the base support does not have to be sealed with respect to the gas space.

In a preferred embodiment, the base support is made up of several parts. The base support contains a core part and at least one cover that can be placed on the core part gastightly. The gas space is then delimited both by the core part and by at least one, in particular two, of the covers. In this way, it is easy to design and construct base supports or gas spaces with a particularly wide range of variants. In particular, a seal is provided between the core part and the cover.

In a preferred variant of this embodiment, at least one, in particular several or all of the terminal bodies is attached to one of the covers. In particular, the corresponding terminal body is exclusively attached to the cover. Alternatively or additionally, at least one of the capacitor stages is attached to the core part. In particular, however, the attachment is made to the core part and to the cover. In particular, this fastening serves at the same time to hold the cover to the core part. The "fastening of the capacitor stage" may in particular mean that at least one component of the capacitor stage, for example one of several capacitors of the capacitor stage, is fastened accordingly. Also, an intermediate piece between two capacitors, for example a connecting line/rod/conductor can be fastened to the base support and thus the capacitors are only indirectly fastened to the base support via this component. This is another way to create variants of Marx arrangements that are particularly favorable in terms of design.

In a preferred embodiment, the capacitor stages can also contain further terminals in addition to the first and second terminal—in particular for intermediate potentials between the terminal potentials.

In a preferred embodiment, at least one, in particular several or all, of the capacitor stages contains at least, in particular exactly, two capacitors connected in series between the first and second voltage terminal. A respective third voltage terminal is then located between the capacitors. In particular, one of the third voltage terminals is an earth terminal (potential 0V in operation); the first and second voltage terminals are then terminals for positive and negative high-voltage potentials, in particular of the same magnitude, i.e. +/−HV.

In a preferred variant of this embodiment, at least one of the capacitor stages is attached by its third voltage terminal to the base support. The third voltage terminal is designed in particular as a through-plating of the base support. In particular, there is an electrically conductive connection between the third voltage terminal and the base support. In particular, all these components are grounded with the third voltage terminal during operation. This results in particularly advantageous designs, both structurally and electrically.

In a preferred embodiment, the main body follows a line of progression in a plane. The line of progression or progressive shape thereof is in particular an annular shape around a longitudinal axis, an S-shape, a zig-zag shape or a combination thereof. In other words, the present invention thus adopts the basic design principle of such an arrangement along a line of progression in the above-mentioned German patent application DE 10 2021 004 466.5. In particular, the housing extends here along and annularly around a longitudinal axis. The capacitor stages are distributed in particular annularly, but also according to an S-shape, a zig-zag course, etc. around the longitudinal axis. In particular, the main body then also has a corresponding shape or follows such a line of progression. In particular, the capacitor stages also extend in parallel in the direction of the longitudinal axis. In particular, the capacitor steps and the cross branches are arranged along the base support following the line of progression. In particular, the capacitor stages and the cross branches are also distributed in a ring around the longitudinal axis.

In a preferred embodiment, the Marx arrangement contains an HF resonator that is at least partially received in the housing and is supplied with energy by the Marx generator during operation. The energy is supplied in particular in the form of the Marx voltage. In this case, the Max arrangement becomes in particular a pulse generator for an HPEM pulse, as basically explained in the above-mentioned German patent application DE 10 2021 004 466.5.

The invention is based on the following findings, observations and considerations and also features the following preferred embodiments. These embodiments are also referred to in part as "the invention" for the sake of simplicity. The embodiments may also contain or correspond here to parts or combinations of the above-mentioned embodiments and/or may also include embodiments not previously mentioned.

According to a first embodiment, the main body is designed as a not completely closed ring, for example a three-quarter ring. For each of the cross branches or spark gaps, a pressure chamber, for example a milled outer contour, is introduced into a core part of the main body and is relatively small in comparison to the main body/core part. It is closed—on two opposite sides of the core part—with two covers, which are sealed in each case ("above" and "below", i.e. on the opposite sides) by a respective seal, in particular in the manner of a "cylinder head seal". A sealing line or sealing surface can be guided on the core part in such a way that connections of the capacitor assemblies with the core part can be passed through or contacted through the core part without the pressure area (gas space) being penetrated by components of the capacitor assembly. This avoids further sealing points at the gas space, which would otherwise be necessary. High-voltage insulators for the cross branches are in particular placed on the outside of the base support, i.e. in the liquid area, i.e. in the fluid space, instead of arranging them on the inside of the base support, i.e. in the gas space.

In a second embodiment, the base support is designed as a solid block in a not completely closed ring shape, for example a three-quarter ring shape. Threaded holes for corresponding high-voltage insulators on the outside of the base support are made in the solid block. The terminal bodies, which also contain the high-voltage insulators, are screwed into the block. The gas volumes (spark chambers) that result between screwed-in high-voltage insulators in the block are connected by oblique holes that can be made from the outside (i.e. from outside the block).

In both cases, parts of the terminal bodies represent high-voltage insulators, which are also the holders of the spark gap electrodes (including conductor, part of the cross branch, with electrode).

The gas space (or the base support) can be configured, for example, in an open, i.e. not completely closed, ring shape. Threads for the polar bodies or their high-voltage insulators are inserted into this main body/core part or ring from both sides. The opposite threads are connected to a core bore, so that a spark chamber automatically results as part of the gas space between the electrodes of the terminal bodies. The individual spark chambers in the form of partial gas spaces are connected to a common gas space via holes drilled at an angle from the outside (outside the base support).

Other features which are considered as characteristic for the invention are set forth in the appended claims.

Although the invention is illustrated and described herein as embodied in a Marx generator with fluid cooling and gas space for spark gaps, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
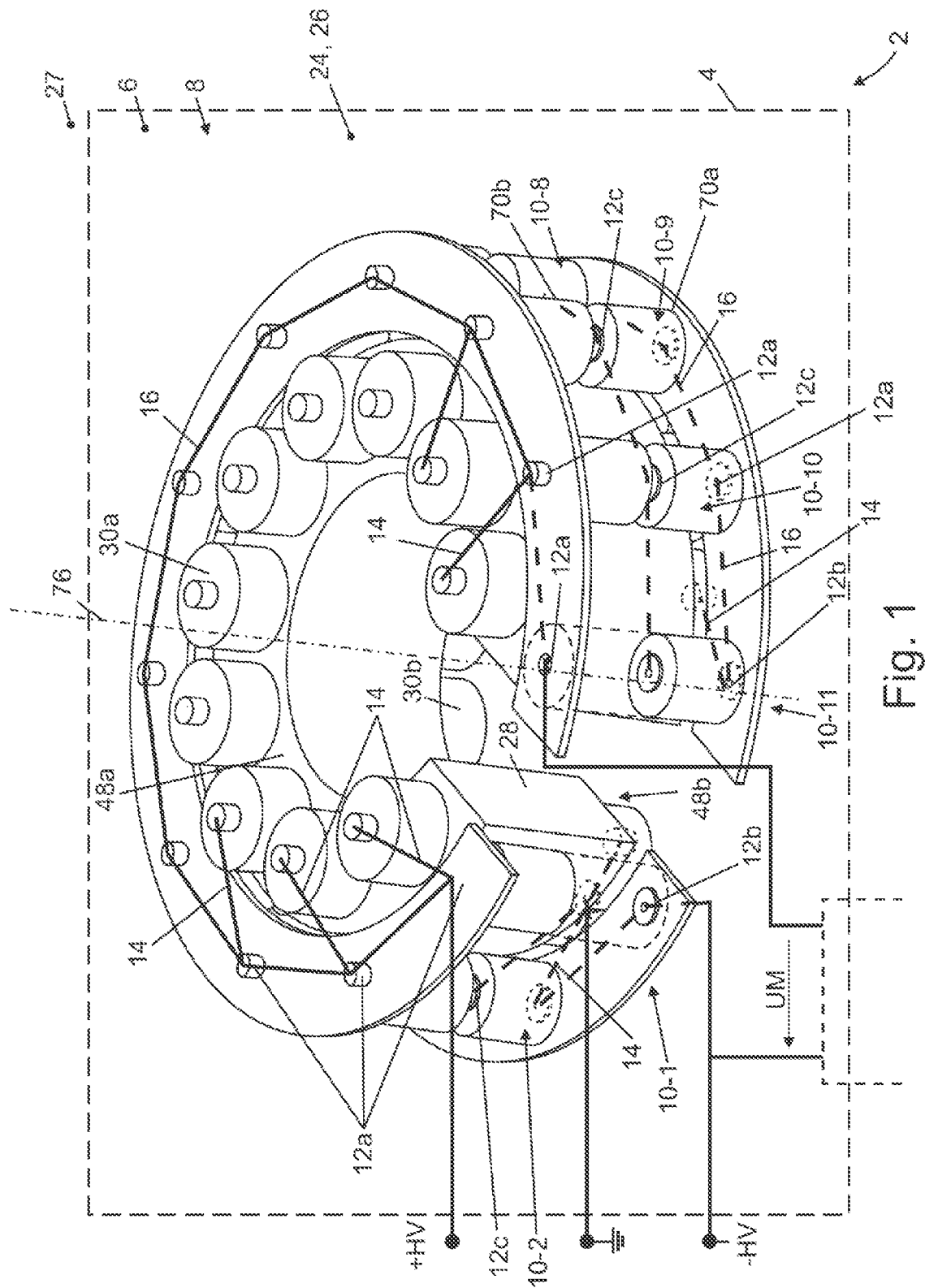
FIG. 1 is a diagrammatic, perspective view of a Marx arrangement.

Referring now to the figures of the drawings in detail and first, particularly to FIG. 1 thereof, there is shown a Marx arrangement 2 with a housing 4, only symbolically indicated here, which surrounds an interior 6. A Marx generator 8 is arranged in the interior 6. With regard to its basic structure from an electrical point of view, the Marx generator 8 is constructed in the customary way. In this respect, it contains a number N of eleven capacitor stages 10-$n$, which are consecutively numbered here from n=1 to n=N=11 (i.e. "10-1", "10-2", ..., "10-10", "10-11"). Each of the capacitor stages 10-$n$ has a first voltage terminal 12$a$ and a second voltage terminal 12$b$.

The Marx generator 8 also contains ten cross branches 14. Two adjacent capacitor stages 10-$n$ and 10-$n$+1 (n=1 ... 10) are connected in each case via one of the ten cross branches 14. More precisely, in each case one cross branch 14 leads from the first voltage terminal 12$a$ of a preceding capacitor stage 10-$n$ to the second voltage terminal 12$b$ of the following capacitor stage 10-$n$+1. In the figure, the cross branches are indicated in part and only for individual cross branches by symbolic connecting lines. For example, a first electrical connection leads from terminal 12$a$ of the capacitor stage 10-1 via the first cross branch 14 to the voltage terminal 12$b$ of capacitor stage 10-2. A tenth cross branch 14 leads from the first terminal 12$a$ of capacitor stage 10-10 to the second terminal 12$b$ of capacitor stage 10-11.

The first terminals 12$a$ of each of two adjacent capacitor stages 10-$n$ are connected in series via charging impedances 16 (for the sake of clarity partly not shown or indicated merely by dashed lines) and are supplied with a positive high-voltage potential +HV during operation, in particular for charging. Likewise, the second terminals 12$b$ of each of two adjacent capacitor stages 10-$n$ are connected in series via charging impedances 16 and are supplied with a negative high-voltage potential −HV during operation. In this respect, their parallel connection results in operation for charging the capacitor stages 10-$n$, because the cross branches 14 form here—to put it simply—electrical open circuits; the charging impedances 16 form electrical short circuits.

In the case of discharge or for the generation of a Marx voltage UM, the charging impedances 16 act as electrical open circuits, and the cross branches 14 act as electrical short circuits, so that the eleven capacitor stages 10-$n$ are then connected in series. The Marx voltage UM results between the second terminal 12$b$ of the first capacitor stage 10-1 and the first terminal 12$a$ of the last capacitor stage 10-11 as—to put it simply—N times the charging voltage of the respective capacitor stages 10-$n$, in this case UM=N*2*HV. For this reason, the capacitor stages 10-$n$ in the Marx generator 8 are referred to as being "connected in series".

Figure 2:
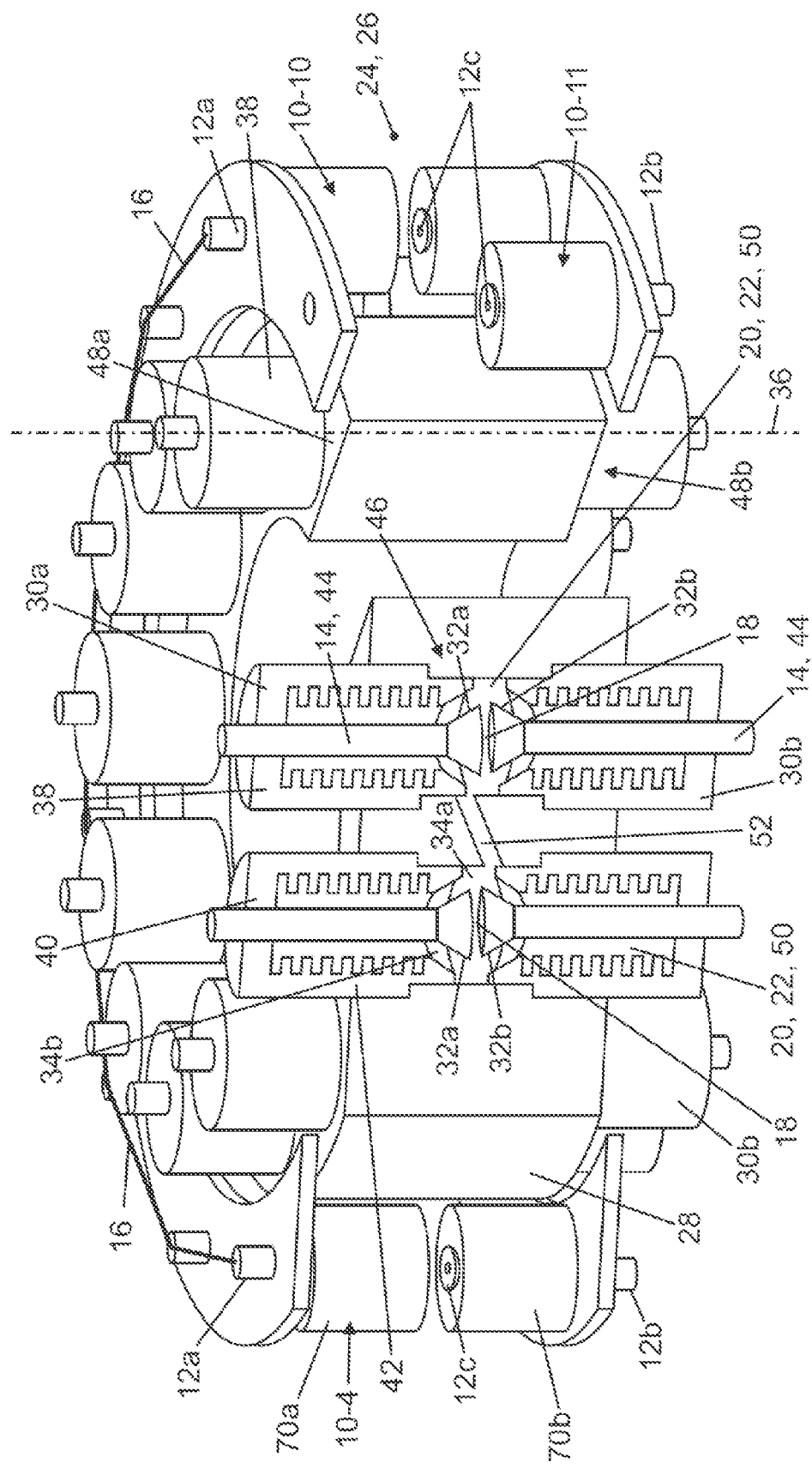
FIG. 2 is a partial sectional view of the Marx generator from FIG. 1.

FIG. 2 shows a partial section through the Marx generator 8 from FIG. 1. Here it can be seen that each of the cross branches 14 contains a spark gap 18. By igniting or switching the spark gap 18, the respective cross branch 14 is brought from its idle state into its short-circuit state.

The Marx arrangement 2 contains a gas space 20. This is arranged in the interior 6 and is designed to be sealed, i.e. gas-tight with respect to the rest of the interior 6. During operation or in the completed state of the Marx generator 8, the gas space 20 contains an insulating gas 22 for the spark gap 18. In the example, the gas space 20 contains all ten spark gaps 18 of all ten cross branches 14. The insulating gas 22 increases the breakdown voltage for the spark gaps 18 so that these can be made shorter with the same breakdown voltage and thus with lower inductances in the event of a short circuit than with a spark gap in air. Connection channels leading from the gas space 20 to the outside of the housing 4 serve to fill or flow through the gas space 20 and are not shown in the figures.

The Marx arrangement 2 further has, in the interior 6, a fluid space 24 which contains a cooling fluid 26 during operation. The fluid space 24 is configured to be fluid-tight, i.e. designed to be fluid-tight with respect to the rest of the interior 6 or an outer space 27 surrounding the housing 4, in particular also with respect to the gas space 20. The cooling fluid 26 cools the Marx generator 8 during operation. For this purpose, it flows through the housing 4 with the aid of openings in the housing 4, which are not shown, and a cooling circuit connected thereto, which continues outside the housing via a cooling unit.

The Marx arrangement 2 includes a base support 28, which is also arranged in the interior 6. The base support 28 partially surrounds the gas space 20, as will be explained in greater detail below.

Each of the spark gaps 18 is formed by two terminal bodies 30$a$,$b$. Each of the terminal bodies 30$a$,$b$ contains one of the electrodes 32$a$,$b$ of the respective spark gap 18. To form the respective spark gap 18, the two associated terminal bodies 30$a$,$b$ are each attached to the base support 28. Only through the terminal bodies 30$a$,$b$ or their attachment or placement on the base support 28 is the gas space 20 completely enclosed or sealed.

In other words, only a part 34$a$ of a walling surrounding the gas space 20 is formed by the base support 28; the remaining part 34$b$ of this walling is formed by the polar bodies 30$a$,$b$.

The gas space 20 also extends here into the respective terminal bodies 30$a$,$b$ so that they also enclose part of the gas space 20, which is accomplished by the part 34$b$ of the walling.

The terminal bodies 30$a$,$b$ each extend along a terminal axis 36. They contain a pot-shaped insulator 38 which in each case extends along the terminal axis 36. The pot shape is formed by a substantially flat and circular disc-shaped base 40 and a hollow cylinder 42. The hollow cylinder 42 extends away from the base 40 along the terminal axis 36. The terminal bodies 30$a$,$b$ contain a conductor 44 extending in the insulator 38. The expression "in the insulator" means that this conductor—coming from the outside—first passes through the base 40 and then extends inside the insulator 38 or in the part of the gas space 20 formed therein. The respective conductor 44 forms a portion of the cross branch 14 and has the electrode 32a or 32b at its free end.

The terminal bodies 30a,b are fastened, in this case screwed, to the base support 28 by means of a respective pair of threads 46. The thread pairing 46 consists of a respective external thread on the insulator 38, which is not shown in more detail in the figures, and which is screwed to an internal thread in the base support 28. The two terminal bodies 30a,b for forming a respective spark gap 18 or a cross branch 14 are each attached to opposite sides 48a,b of the base support 28.

The gas space 20 consists of a total of ten spark chambers 50, one for each spark gap 18 or each cross branch 14, and nine connecting channels 52. Two adjacent spark chambers 50 in the base support 28 are connected by one of the—in relation to the size of the spark chamber 50—relatively small connecting channels 52.

The Marx arrangement 2 further contains an HF resonator 100, here only symbolically indicated, which is partially accommodated here in the housing 4 and which in operation is supplied with energy, namely the Marx voltage UM, by the Marx generator 8. In a real embodiment, for example according to German patent application DE 10 2021 004 466.5, the HF resonator 100 is centrally arranged within the Marx generator 8 and extends along and concentrically to a longitudinal axis 76 of the entire Marx arrangement 2.

Figure 3:
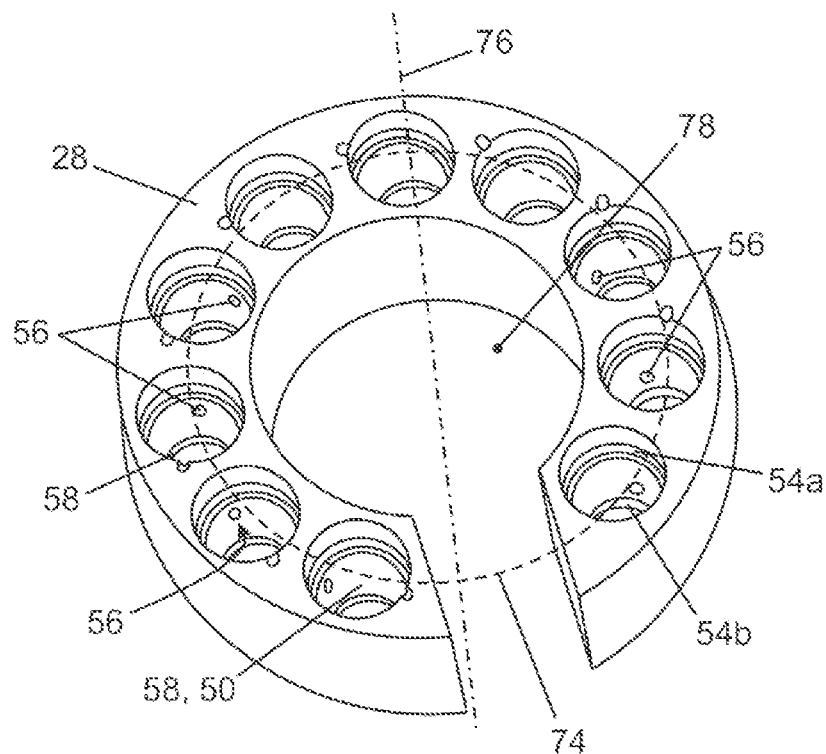
FIG. 3 is a perspective view of a base support from FIG. 1.

FIG. 3 shows a complete view of the base support 28 from FIGS. 1 and 2 without further components.

Figure 4:
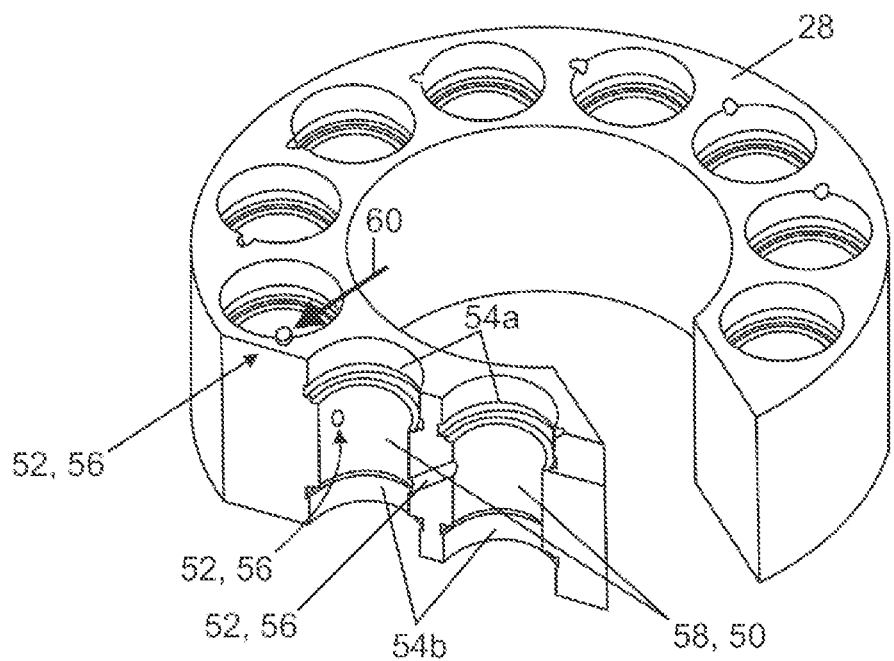
FIG. 4 is a partial sectional view of the base support from FIG. 1.

FIG. 4 shows the corresponding base support 28 in partial section. For each of the spark gaps 18 or cross branches 14, two receptacles 54a,b are provided in the base support 28. The receptacles 54a,b correspond to or have the above-mentioned internal threads for screwing in the insulators 38. Furthermore, a through-opening 58 is made in the base support 28 for each of the spark gaps 18 or cross branches 14. The spark chamber 50 is formed in this through-opening 58 by screwing the terminal bodies 30a,b into the base support 28.

Furthermore, the connecting channels 52 are created in the base support 28 by apertures 56, in this case bores, which can be formed obliquely from the outside, i.e. from outside the base support 28. This can be seen in particular in FIG. 4, because here (arrow 60) a free view in the drilling direction is possible along one of the apertures 56 through the base support 28. In a corresponding direction, the aperture 56 can thus be created, for example, by simply drilling with the aid of a drill.

The base support 28 is configured here as an interrupted ring or ring portion (along an annular line of progression 74, see below) made of solid plastics material including the threaded holes or internal thread (receptacles 54a,b) for the high-voltage insulators 38. The capacitor stages 10 or their capacitors 70a,b (see below) lie radially outside the ring or base support 28 with respect to the longitudinal axis 76.

Figure 5:
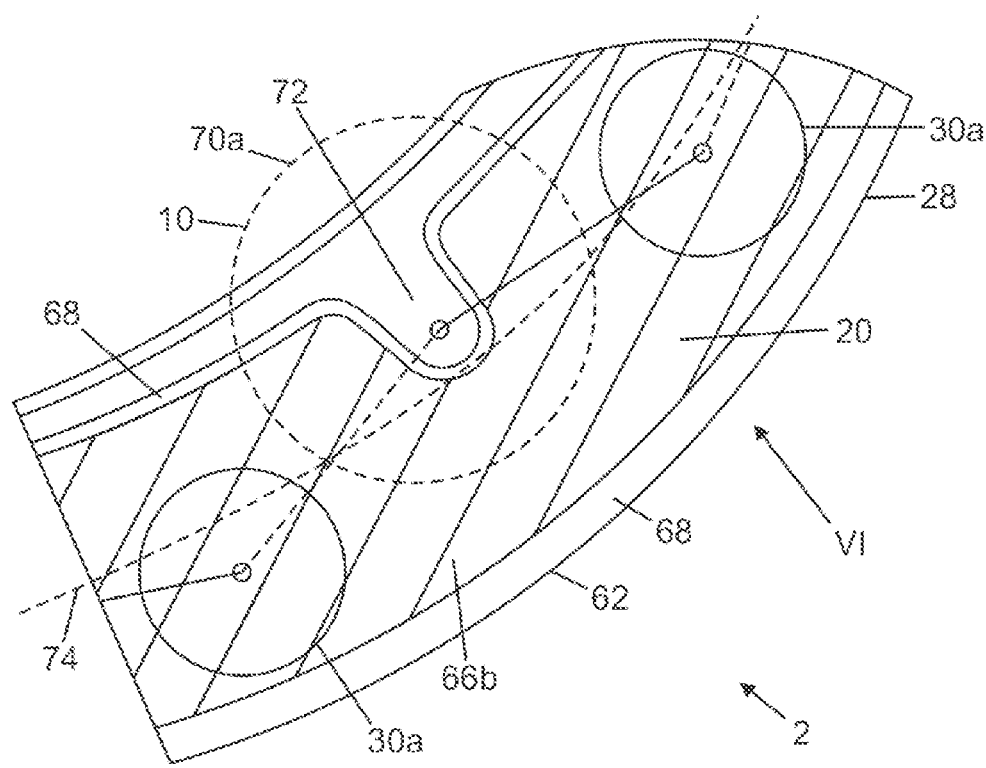
FIG. 5 is a plan view of a detail of an alternative Marx arrangement viewing direction of arrow V in FIG. 6)
Figure 6:
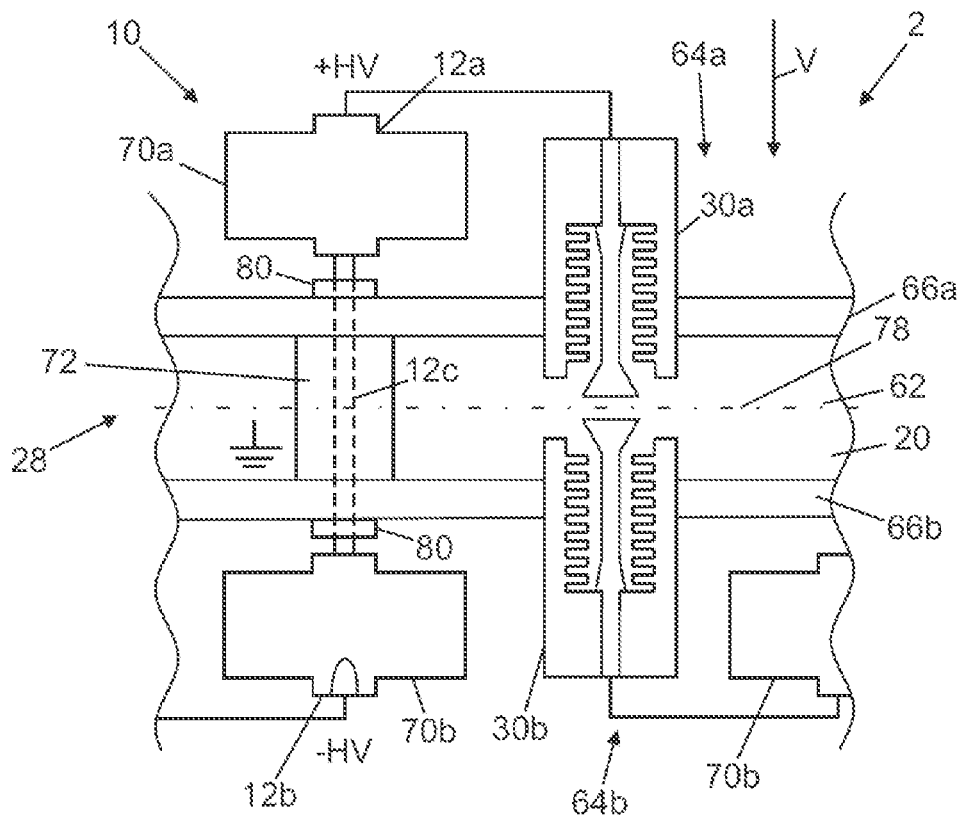
FIG. 6 is a side view of the Marx arrangement from FIG. 5 (viewing direction of arrow VI in FIG. 5).

FIG. 5 shows a detail of an alternative embodiment of a Marx arrangement 2 in plan view (in the direction of the arrow V in FIG. 6). Namely, a part of the base support 28 with one and a part of a second (FIG. 6) capacitor stage 10 and portions of adjacent cross branches 14 or their terminal bodies 30a,b.

FIG. 6 shows the corresponding Marx arrangement 2 in side view, namely in the direction of arrow VI from FIG. 5.

The terminal bodies 30a,b are identical to the exemplary embodiment according to FIGS. 1 to 4. However, in particular the base support 28 and the gas space 20 are designed alternatively here. The likewise alternative capacitor stages 10 are here attached directly to the base support 28. How-ever, the capacitor stages 10 are attached to the base support 28 outside the gas space 20. The gas space 20 therefore does not touch any part of the capacitor stages 10 at any point.

The base support 28 is constructed here of several parts, namely a core part 62 and a cover 66a,b on the opposite sides 64a,b thereof. The cover 66a,b is shown transparent in FIG. 5, i.e. FIG. 5 shows a view of the core part 62 and the underlying cover 66b. The gas space 20 is marked with dashed lines in FIG. 5 for clarity.

The covers 66a,b are each mounted gas-tightly on the core part 62. Seals 68—running in the manner of a cylinder head gasket—between the core part 62 and the respective cover 66a,b are used for this purpose. In this embodiment, the terminal bodies 30a,b are attached to the base support 28 in that the terminal body 30a is attached exclusively to the cover 66a, and the terminal body 30b is attached exclusively to the cover 66b. The capacitor stages 10-n, on the other hand, are attached to the covers 66a,b as well as to the core part 62. This is done as now described.

Incidentally, as with all the capacitor stages 10 in FIGS. 1 to 4, the capacitor stage 10 here includes two capacitors 70a,b connected in series between the first terminal 12a on the second terminal 12b. Between the two capacitors 70a,b is a third voltage terminal 12c. The respective third voltage terminals 12c of all capacitor stages 10-n are each electrically conductively connected to one another and, in the exemplary embodiment, are connected to ground potential.

In FIGS. 5 and 6, the third terminal 12c is designed as a mechanically stable through-plating through the base support 28 that supports the capacitors 70a,b. The through-plating runs outside the gas space 20. The through-plating runs here outside the gas space 20. For this purpose, the gas space 20 has respective indentations 72 at the location of the capacitor stages 10-n, so that the through-plating finds space within this respective indentation 72. The seal 68 also follows the respective indentation 72, so that the through-plating does not have to be sealed with respect to the gas space 20. The through-plating serves as a mechanical support for the respective capacitor stage 10-n or the capacitors 70a,b.

The capacitor stages 10-n are thus attached in the present case to the base support 28 with their third terminal 12c. In a manner not explained in greater detail, the terminal 12c or the through-plating here also serves to press the covers 66a,b against the core part 62 while pressing the seals 68. In the exemplary embodiment, this is realized by screwing nuts 80 onto the through-plating or the terminal 12c in the form of a threaded rod.

In all examples, the main body 28 follows the circular line of progression 74 in the sense of the above-mentioned German patent application DE 10 2021 004 466.5. The line of progression 74 lies in a plane 78 which is perpendicular to the longitudinal axis 76 of the entire Marx arrangement 2. The capacitor stages 10-n as well as the spark gaps 18 or cross branches 14 are also arranged along this line of progression 74, i.e. here in each case annularly concentrically around the longitudinal axis 76. This leads to the particularly low-inductance design of the Marx generator 8, as explained in German patent application DE 10 2021 004 466.5.

The following is a summary list of reference numerals and the corresponding structure used in the above description of the invention.

LIST OF REFERENCE SIGNS

2 Marx arrangement
4 housing 6 interior
8 Marx generator
10-n capacitor stage (n=1, 2, . . . , 11)
12a-c voltage terminal
14 transverse branch
16 charging impedance
18 spark gap
20 gas space
22 insulating gas
24 fluid space
26 cooling fluid
27 outer space
28 main support
30a,b terminal body
32a,b electrode
34a,b part (walling)
36 terminal axis
38 insulator
40 base
42 hollow cylinder
44 conductor
46 thread pairing
48a,b side (base support)
50 spark chamber
52 connecting channel
54a,b receptacle
56 aperture
58 through-opening
60 arrow
62 core part
64a,b side (core part)
66a,b cover
68 seal
70a,b capacitor
72 indentation
74 line of progression
76 longitudinal axis
78 plane
80 nut
100 HF resonator
+/−HV high-voltage potential
UM Marx voltage

The invention claimed is:

1. A Marx configuration, comprising:
a housing surrounding an interior;
a Marx generator disposed in said interior, said Marx generator containing:
a plurality of capacitor stages connected in series, and each having at least one first and one second voltage terminal; and
cross branches, wherein each two adjacent said capacitor stages between said first terminal of a preceding capacitor stage and said second terminal of a following capacitor stage are connected by one of said cross branches, wherein each of said cross branches contains a spark gap resulting in a plurality of spark gaps, said cross branches each have at least one sealed gas space for an insulating gas for said spark gaps resulting in a plurality of sealed gas spaces, each of said sealed gas spaces being disposed in said interior and containing at least two said spark gaps, wherein all of said spark gaps are disposed in a respective one of said sealed gas spaces;
said housing containing a sealed fluid space for a cooling fluid for said Marx generator;
at least one base support disposed in said interior and surrounding said at least one sealed gas space partially; and
at least one of said spark gaps is formed by two terminal bodies, each of said terminal bodies contains an electrode of a respective one of said spark gaps, wherein both of said terminal bodies are fastened to said at least one base support to form said spark gap, and said at least one sealed gas space is thereby completely surrounded by said terminal bodies.

2. The Marx configuration according to claim 1, wherein at least one of said terminal bodies surrounds part of said at least one sealed gas space.

3. The Marx configuration according to claim 2, wherein at least one of said terminal bodies contains a pot-shaped insulator extending along a terminal axis, and contains a conductor which extends at least partially in said pot-shaped insulator along the terminal axis, forms a portion of one of said cross branches, and has an electrode at its free end.

4. The Marx configuration according to claim 1, wherein at least one of said terminal bodies is fastened to said at least one base support by means of a pair of threads.

5. The Marx configuration according to claim 1, wherein said two terminal bodies of at least one of said spark gaps are attached to said at least one base support on two opposite sides thereof.

6. The Marx configuration according to claim 1, wherein said sealed gas spaces in each case have one spark chamber per said spark gap, said spark chambers being connected by connecting channels in said at least one base support.

7. The Marx configuration according to claim 6, wherein for at least one of said spark gaps, said terminal bodies each having two receptacles and a respective said spark chamber being in the form of a through-opening connecting said receptacles and are made in said at least one base support, and said connecting channels are created in said at least one base support by apertures formed therein and are made obliquely from an outside.

8. The Marx configuration according to claim 1, wherein at least one of said capacitor stages is attached to said at least one base support.

9. The Marx configuration according to claim 8, wherein at least one of said capacitor stages is attached to said at least one base support outside said at least one sealed gas space.

10. The Marx configuration according to claim 1, wherein said at least one base support is made up of several parts and contains a core part and at least one cover that can be placed on said core part gas-tightly, said at least one sealed gas space being delimited both by said core part and by said at least one cover.

11. The Marx configuration according to claim 10, wherein:
said at least one cover is one of a plurality of covers; and
at least one of said terminal bodies is attached to one of said covers and/or at least one of said capacitor stages is attached to said core part.

12. The Marx configuration according to claim 1, wherein at least one of said capacitor stages contains, connected in series between said first and second voltage terminals, two capacitors, between which there is a respective third voltage terminal.

13. The Marx configuration according to claim 12, wherein at least one of said capacitor stages is attached by said third voltage terminal to said at least one base support.

14. The Marx configuration according to claim 1, wherein said at least one base support follows a line of progression in a plane.

15. The Marx configuration according to claim 1, further comprising a high-frequency resonator that is at least partially received in said housing and is supplied with energy by said Marx generator during operation.

* * * * *